United States Patent
Miura

(10) Patent No.: US 9,184,362 B2
(45) Date of Patent: Nov. 10, 2015

(54) ELECTRONIC-COMPONENT MOUNTING STRUCTURE

(71) Applicant: Murata Manufacturing Co., Ltd., Nagaokakyo-shi, Kyoto-fu (JP)

(72) Inventor: Tadamasa Miura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 18 days.

(21) Appl. No.: 13/966,317

(22) Filed: Aug. 14, 2013

(65) Prior Publication Data

US 2013/0328153 A1   Dec. 12, 2013

Related U.S. Application Data

(63) Continuation of application No. PCT/JP2012/052655, filed on Feb. 7, 2012.

(30) Foreign Application Priority Data

Feb. 24, 2011   (JP) .................................. 2011-038764

(51) Int. Cl.
*H01L 23/12* (2006.01)
*H01L 35/02* (2006.01)
*H01C 1/014* (2006.01)
(Continued)

(52) U.S. Cl.
CPC ................ *H01L 35/02* (2013.01); *H01C 1/014* (2013.01); *H01C 1/14* (2013.01); *H01C 1/144* (2013.01); *H01C 7/008* (2013.01); *H01L 24/16* (2013.01); *H01C 1/1406* (2013.01); *H01C 1/1413* (2013.01); *H01L 2924/0002* (2013.01); *H01L 2924/00013* (2013.01)

(58) Field of Classification Search
CPC . H01L 35/02; H01L 24/16; H01L 2924/0002; H01L 2924/00013; H01L 2924/15313
USPC .......... 257/467, 723, E21.586, 4, 701; 438/6, 438/121, 125
See application file for complete search history.

(56) References Cited

U.S. PATENT DOCUMENTS

| | | | |
|---|---|---|---|
| 4,870,225 A | 9/1989 | Anao et al. | |
| 2007/0001297 A1* | 1/2007 | Higasa et al. | ................. 257/723 |

FOREIGN PATENT DOCUMENTS

| | | |
|---|---|---|
| JP | 61-32377 A | 2/1986 |
| JP | 61-193401 A | 8/1986 |

(Continued)

OTHER PUBLICATIONS

Official Communication issued in corresponding Japanese Patent Application No. 2013-500936, mailed on Jan. 14, 2014.

(Continued)

*Primary Examiner* — Jarrett Stark
*Assistant Examiner* — Shahed Ahmed
(74) *Attorney, Agent, or Firm* — Keating & Bennett, LLP

(57) ABSTRACT

An electronic-component mounting structure includes an electronic component which includes a metal substrate, a semiconductor ceramic layer located on the metal substrate, a pair of split electrodes located on the semiconductor ceramic layer, and plating films located on the split electrodes and the metal substrate, and a mounting body on which lands to be connected to the respective split electrodes of the electronic component are provided. The position of a peripheral end portion of each land to be connected to the corresponding split electrode is located farther inside than the position of a peripheral end portion of the split electrode. In addition, a plane area of the land is smaller than that of the split electrode.

14 Claims, 3 Drawing Sheets

(51) Int. Cl.
*H01C 1/14* (2006.01)
*H01C 7/00* (2006.01)
*H01C 1/144* (2006.01)
*H01L 23/00* (2006.01)

(56) References Cited

FOREIGN PATENT DOCUMENTS

| | | |
|---|---|---|
| JP | 61-242002 A | 10/1986 |
| JP | 61-245502 A | 10/1986 |
| JP | 63-10502 U | 1/1988 |
| JP | 63-169793 A | 7/1988 |
| JP | 04-038892 A | 2/1992 |
| JP | 06-209158 A | 7/1994 |
| JP | 06-302406 A | 10/1994 |
| JP | 11-054301 A | 2/1999 |
| JP | 2003-007510 A | 1/2003 |
| WO | 2011/024724 A1 | 3/2011 |

OTHER PUBLICATIONS

Official Communication issued in International Patent Application No. PCT/JP2012/052655, mailed on May 22, 2012.

* cited by examiner

FIG. 5A
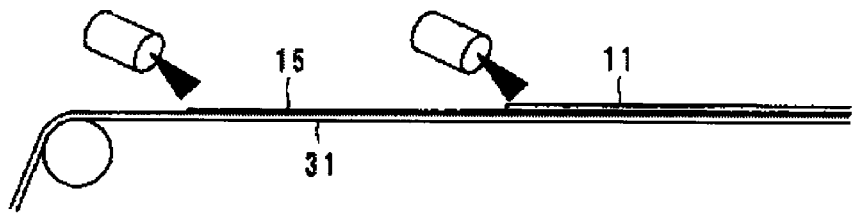
FIG. 5B         FIG. 5C         FIG. 5D
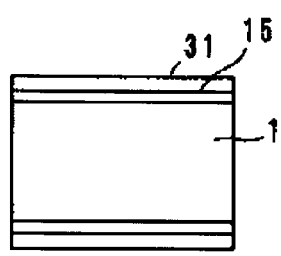 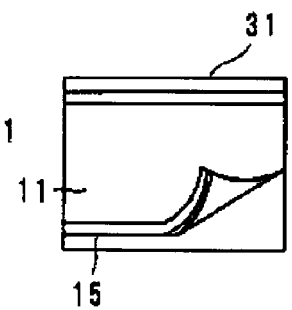 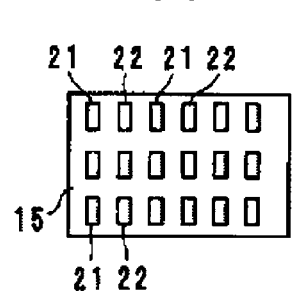
FIG. 5E
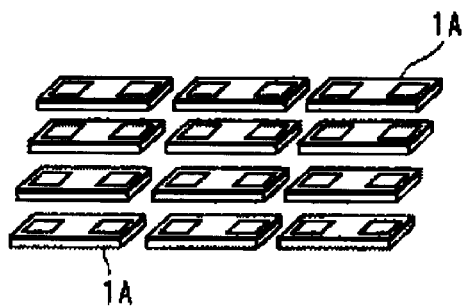
FIG. 6
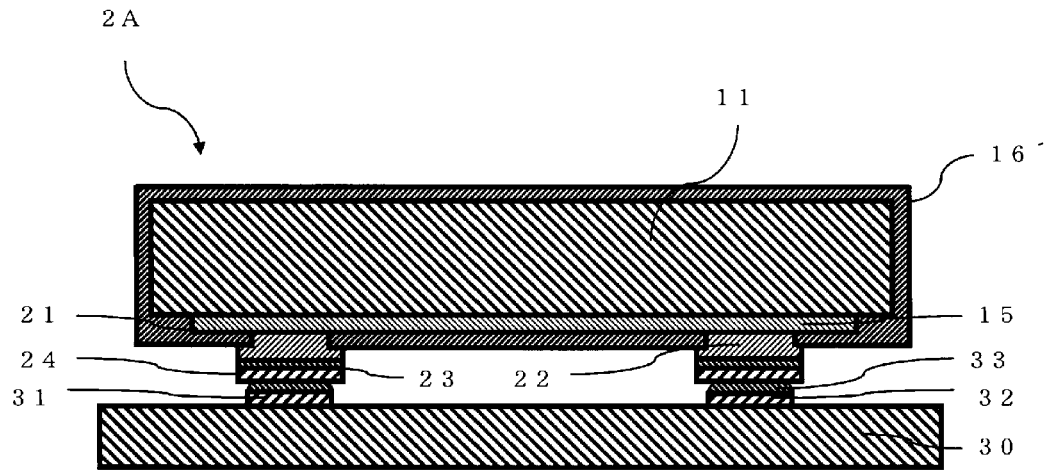

ELECTRONIC-COMPONENT MOUNTING STRUCTURE

BACKGROUND OF THE INVENTION

1. Field of the Invention

The present invention relates to a mounting structure in which an electronic component including a metal substrate, a semiconductor ceramic layer, and split electrodes, is mounted on a mounting body.

2. Description of the Related Art

Heretofore, as an NTC thermistor or a PTC thermistor, which is used as a temperature sensor in a protective circuit, a thermistor disclosed in Japanese Unexamined Patent Application Publication No. 61-245502 has been known. The thermistor disclosed in Japanese Unexamined Patent Application Publication No. 61-245502 is formed of a flat metal substrate also functioning as an electrode, a temperature-sensitive resistive film formed on one primary surface of the metal substrate, and one electrode film formed on the temperature-sensitive resistive film.

However, the above-described thermistor has a structure in which the flat metal substrate is used as one electrode, and the electrode film formed as the topmost layer is used as the other electrode. Hence, when this thermistor is mounted on a substrate or the like, an electrical connection to the electrode film has to be performed by wire bonding, and hence mounting to an extremely small space has been impossible. For example, when the thermistor as described above is used as a temperature sensor of an IC component mounted on a printed circuit board, a small space, such as 150 μm to 200 μm, is formed between the printed circuit board and the IC component, and the thermistor is preferably mounted in this space. However, it is practically difficult to perform mounting in this small space by wire bonding.

Accordingly, the invention disclosed in PCT/JP2010/64089 was developed by the present inventor. In particular, in the application disclosed PCT/JP2010/64089, there are provided a metal substrate, a thin thermistor layer formed on the metal substrate, and a pair of split electrodes formed on the thin thermistor layer. According to the structure as described above, solder mounting can be performed on a printed circuit board by a reflow method or the like. When solder mounting is performed, in general, in order to improve solder wettability, plating films are formed on the split electrodes. In the structure as described above, when a split-electrode side is mounted on lands formed on the printed circuit board, solder rise from the lands to a surface of the metal substrate occurs, and a problem that the split electrodes are electrically connected to the metal substrate with the solder occurs. As a result, a short-circuit defect is disadvantageously generated.

SUMMARY OF THE INVENTION

Accordingly, preferred embodiments of the present invention provide an electronic-component mounting structure in which solder mounting can be performed, and solder rise to a metal substrate is prevented from occurring.

A first aspect of a preferred embodiment of the present invention provides an electronic-component mounting structure including an electronic component which includes a metal substrate, a semiconductor ceramic layer located on the metal substrate, a pair of split electrodes located on the semiconductor ceramic layer, and plating films located on the split electrodes and the metal substrate; and a mounting body on which lands to be connected to the respective split electrodes of the electronic component are provided. In the electronic-component mounting structure described above, the position of a peripheral end portion of each land to be connected to the corresponding split electrode is located farther inside than the position of a peripheral end portion of the split electrode.

As described above, since the position of the peripheral end portion of the land is located farther inside the electronic component than the position of the peripheral end portion of the split electrode, solder applied to the land is prevented from reaching a peripheral side of the metal substrate, and solder rise to the plating film located on a surface of the metal substrate is prevented.

In addition, a plane area of the land is preferably smaller than a plane area of the split electrode according to a preferred embodiment of the present invention.

Since the plane area of the land is preferably smaller than the plane area of the split electrode, the solder applied to the land is not more likely to reach the peripheral side of the metal substrate, and hence the solder rise to the metal substrate is further prevented.

In addition, the thickness of the metal substrate of the electronic component is preferably about 10 μm to about 80 μm, for example, and the thickness of the ceramic layer is preferably about 1 μm to about 10 μm, for example, according to a preferred embodiment of the present invention.

In the electronic component as described above, since the reduction in height thereof is realized, mounting can be performed even in an extremely small space, such as about 200 μm or less, for example, and in addition, since the thin ceramic layer and the thin metal substrate are integrally formed together, flexible properties can be obtained. Hence, even if a stress is applied to the electronic component, cracks are not likely to be generated in a ceramic layer portion, and even if irregularities and steps are present in a mounting space, mounting can be carried out. In the case of the electronic component having flexibility as described above, if the electronic component receives a stress when mounted on a mounting body, the position of the peripheral side of the metal substrate is liable to be shifted in a thickness direction, and the position of the peripheral end portion of the metal substrate and the position of the land are liable to be closer to each other. As a result, the solder rise to the surface of the metal substrate is liable to occur. However, when a first or a second structure according to various preferred embodiments of the present invention is used, the solder rise is sufficiently prevented. That is, in particular, preferred embodiments of the present invention can be effectively applied to a flexible electronic component which satisfies the above conditions.

The metal substrate of the electronic component preferably has a sheet shape and is made of a metal powder paste, and the ceramic layer preferably has a sheet shape and is made of a ceramic slurry according to a preferred embodiment of the present invention.

In addition, the sheet-shaped metal substrate and the sheet-shaped ceramic layer are preferably obtained by firing while being integrally laminated together according to a preferred embodiment of the present invention.

In the structure as described above, there can be provided an electronic component in which flexibility can be reliably obtained, and in addition, cracks and the like are not likely to be generated in the ceramic layer.

In addition, a protective layer made of an insulating material is preferably provided on at least a surface of the ceramic layer on which the split electrodes are provided according to a preferred embodiment of the present invention.

When the above structure is formed, the plating film formed on the split electrode can be reliably insulated from the metal substrate. Accordingly, the solder applied to the land does not reach the peripheral side of the metal substrate, and the solder rise to the surface of the metal substrate is reliably prevented.

In addition, the plating film is preferably provided on a surface of the metal substrate according to a preferred embodiment of the present invention.

When the plating film is formed by electrolytic plating, it is preferable since the manufacturing process is easy, and a dense plating film can be obtained. However, when the plating films are formed on the split electrodes by electric field plating, the plating film is also formed on the metal substrate formed from a metal. In this case, since the same plating film is formed on both the split electrode and the metal substrate, the solder rise to a surface of the plating film on the metal substrate is more liable to occur. However, according to the first or the second structure of various preferred embodiments of the present invention, the solder rise can be sufficiently prevented. That is, in particular, preferred embodiments of the present invention are effectively applied to an electronic component which satisfies the above condition in which the plating film is provided on the surface of the metal substrate.

According to various preferred embodiments of the present invention, solder mounting can be performed, and in addition, since the solder rise to the surface of the metal substrate is prevented from occurring, a short-circuit defect is prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A-5E include views each showing an example of a method for manufacturing the flexible thermistor 1A according to the first preferred embodiment of the present invention.

FIG. 6 is a cross-sectional view of a mounting structure of a flexible thermistor according to a second preferred embodiment of the present invention.

DETAILED DESCRIPTION OF THE PREFERRED EMBODIMENTS

Figure 1:
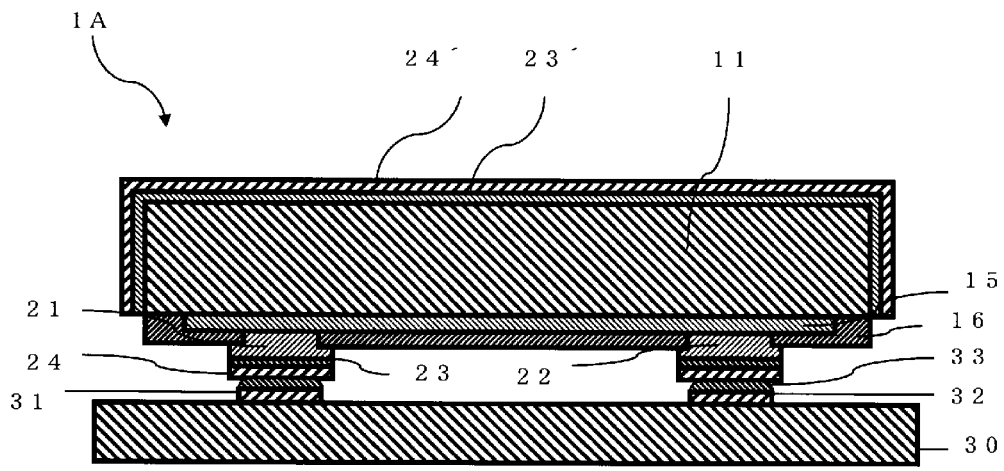
FIG. 1 is a cross-sectional view showing a mounting structure of a flexible thermistor according to a first preferred embodiment of the present invention.

FIG. 1 is a cross-sectional view showing an electronic-component mounting structure according to a first preferred embodiment of the present invention. The mounting structure will be described using a flexible thermistor 1A as one example of an electronic component according to a preferred embodiment of the present invention.

A mounting structure of the flexible thermistor 1A according to a preferred embodiment of the present invention includes a flexible thermistor 1A including a metal substrate 11, a semiconductor ceramic layer 15 located on the metal substrate 11, and a pair of split electrodes 21 and 22 located on the semiconductor ceramic layer 15; and a printed circuit board 30 functioning as a mounting body on which lands 31 and 32 to be connected to the respective split electrodes 21 and 22 of the flexible thermistor 1A are provided. A Ni plating film 23 and an Sn plating film 24 are formed in this order on the surface of each of the split electrodes 21 and 22. In addition, a Ni plating film 23' and an Sn plating film 24' are provided on surfaces of the metal substrate 11. The reason for this is that when the Ni plating film 23 and the Sn plating film 24 are formed on the surface of each split electrode by electric field plating, the plating films are also inevitably formed on the metal substrate 11. In addition, when electric field plating is not used, the Ni plating film 23' and the Sn plating film 24' may not be always formed. In this case, although a protective layer 16 is preferably provided on the surface of the semiconductor ceramic layer 15, this protective layer 16 may not be always provided.

In various preferred embodiments of the present invention, the positions of peripheral end portions of the lands 31 and 32 preferably are located farther inside than the positions of peripheral end portions of the split electrodes 21 and 22, respectively. With the structure as described above, the positions of the peripheral end portions of the lands 31 and 32 to which solders 33 are each to be applied farther than the position of a respective peripheral end portion of the metal substrate 11. Hence, even when solder is applied on the Ni plating film 23 and the Sn plating film 24, which are located on each of the split electrodes 21 and 22, since the positions of the peripheral end portions of the lands 31 and 32 are each far from the position of the peripheral end portion of the metal substrate 11, the solder 33 is prevented from rising to the metal substrate 11 or the Ni plating film 23' and the Sn plating film 24', each of which is arranged along the peripheral end portion of the metal substrate 11.

In this case, the peripheral end portion of the metal substrate 11 indicates peripheral ends of side surfaces and end surfaces of the metal substrate 11. In addition, the peripheral end portion of each of the split electrodes 21 and 22 indicates a peripheral end portion which is located in a planar direction thereof and at a position adjacent to the peripheral end portion of the metal substrate 11. In addition, the peripheral end portion of each of the lands 31 and 32 indicates a peripheral end portion which is located in a planar direction parallel or substantially parallel to the printed circuit board 30 and at a position adjacent to the peripheral end portion of the metal substrate 11. In preferred embodiments of the present invention, the positions of the peripheral end portions of the lands 31 and 32 are located farther inside than the positions of the peripheral end portions of the split electrodes 21 and 22, respectively, that is, are located farther inside than the peripheral end portion of the metal substrate 11. Furthermore, when the plane areas of the lands 31 and 32 are smaller than the plane areas of the split electrodes 21 and 22, respectively, the distance between the metal substrate 11 and each of the lands 31 and 32 can be increased, and hence the solder 33 can be made to stay at the positions of the Ni plating film 23 and the Sn plating film 24, which are provided on each of the split electrodes 21 and 22. Hence, the solder 33 is prevented from rising.

In addition, in general, the lands 31 and 32 provided on the printed circuit board 30 are frequently designed so as to have larger plane areas than those of the split electrodes 21 and 22, respectively, which are to be connected to the lands 31 and 32. The reason for this is to absorb displacement which occurs when the electronic component is mounted and to increase the degree of freedom in mounting. On the other hand, the solder 33 is liable to rise when the metal substrate 11 is located close to the mounting body or when the peripheral end portion of each of the lands 31 and 32 becomes closer to the peripheral end portion of the metal substrate 11 due to the formation of the Ni plating film 23' and the Sn plating film 24' on the surfaces of the metal substrate 11. Hence, in preferred embodiments of the present invention, it was discovered that when the peripheral end portions of the lands 31 and 32 to be connected to the split electrodes 21 and 22, respectively, are arranged so as to be located farther inside than the peripheral end portions of the split electrodes 21 and 22, the solder 33 is not likely to rise to the metal substrate 11, and this is the novel and unexpected discovery.

Hereinafter, a flexible thermistor preferably used as the electronic component according to a preferred embodiment of the present invention and a method for manufacturing the same will be described in more detail.

Figure 2A:
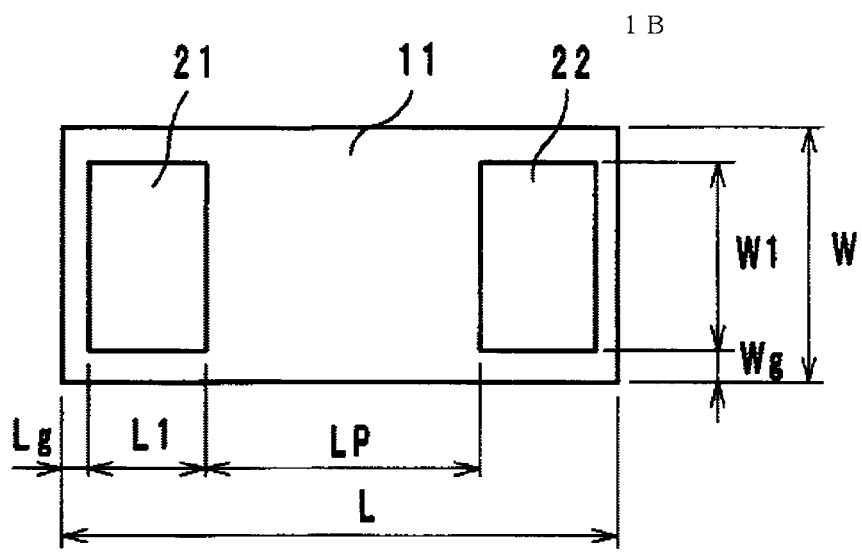
FIG. 2A is a plan view of a flexible thermistor 1B according to the first preferred embodiment.
Figure 2B:
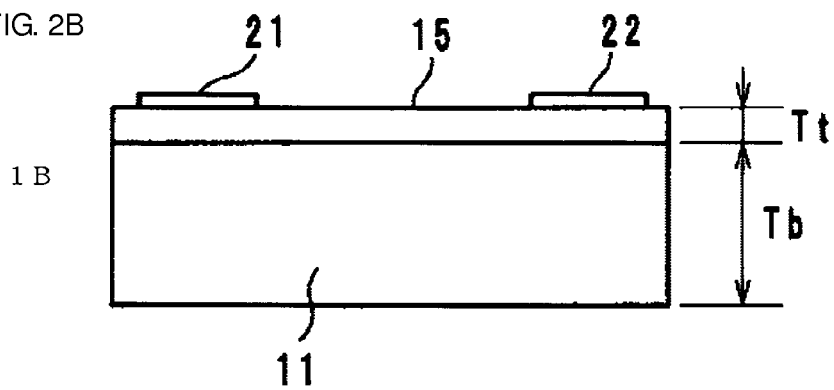
FIG. 2B is a cross-sectional view of the flexible thermistor 1B according to the first preferred embodiment of the present invention.

FIG. 2A is a schematic plan view of a flexible thermistor 1B, and FIG. 2B is a front view thereof. The flexible thermistor 1B is a more simplified component of the flexible thermistor 1A. This flexible thermistor 1B includes a metal substrate 11, a semiconductor ceramic layer 15 located on the metal substrate 11, and a pair of split electrodes 21 and 22 located on the semiconductor ceramic layer 15. The metal substrate 11 is obtained preferably by firing a sheet-shaped body formed from a metal powder paste, the semiconductor ceramic layer 15 is obtained by firing a sheet-shaped body formed from a ceramic slurry, and the split electrodes 21 and 22 are each obtained by firing an electrode material paste, for example. The sheet-shaped body formed from a metal powder paste, the sheet-shaped body formed from a ceramic slurry, and an electrode material paste are integrally fired. In addition, at least the metal substrate 11 and the semiconductor ceramic layer 15 may be obtained by integral firing.

The thickness of the metal substrate 11 preferably is, for example, about 10 μm to about 80 μm, the thickness of the semiconductor ceramic layer 15 preferably is about 1 μm to about 10 μm, the thickness of each of the split electrodes 21 and 22 preferably is about 0.1 μm to about 10 μm, and the total thickness of the flexible thermistor 1B preferably is about 10 μm to about 100 μm, for example.

As the semiconductor ceramic layer 15, a ceramic material having an NTC characteristic and containing appropriate amounts of Mn, Ni, Fe, Ti, Co, Al, Zn, and the like in an arbitrary combination may be used. In this example, although oxides of elements selected from the above transition metal elements are used and mixed together, a carbonate, a hydroxide, and/or the like of an element selected from the above elements may also be used as a starting raw material. For the metal substrate 11 and the split electrodes 21 and 22, a single noble metal, such as Ag, Pd, Pt, or Au, a single base metal, such as Cu, Ni, Al, W, or Ti, or an alloy containing at least one of the above metals may be used.

As a method for forming the metal substrate 11 and the semiconductor ceramic layer 15 to have a sheet shape, although a doctor blade method is generally used, a screen printing method, a gravure printing method, or an ink jet method may also be used, for example. The split electrodes 21 and 22 may be formed, for example, by a screen printing method, a sputtering method, or a deposition method.

Figure 3:
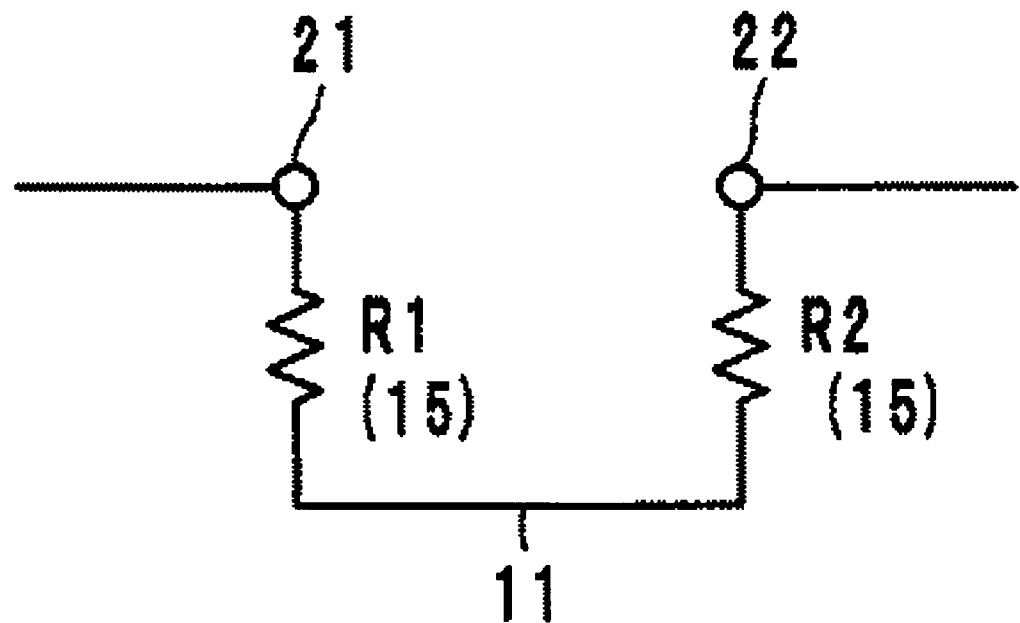
FIG. 3 shows an equivalent circuit of the flexible thermistor 1A according to the first preferred embodiment of the present invention.

FIG. 3 is an equivalent circuit of the flexible thermistor 1B. The split electrodes 21 and 22 are used as an input and an output terminal, and resistances R1 and R2 are provided by the semiconductor ceramic layer 15 and are also electrically connected in series to each other through the metal substrate 11. That is, the resistances R1 and R2 provided by the semiconductor ceramic layer 15 in a thickness direction between the metal substrate 11 and the split electrodes 21 and 22 define a thermistor circuit.

Figure 4:
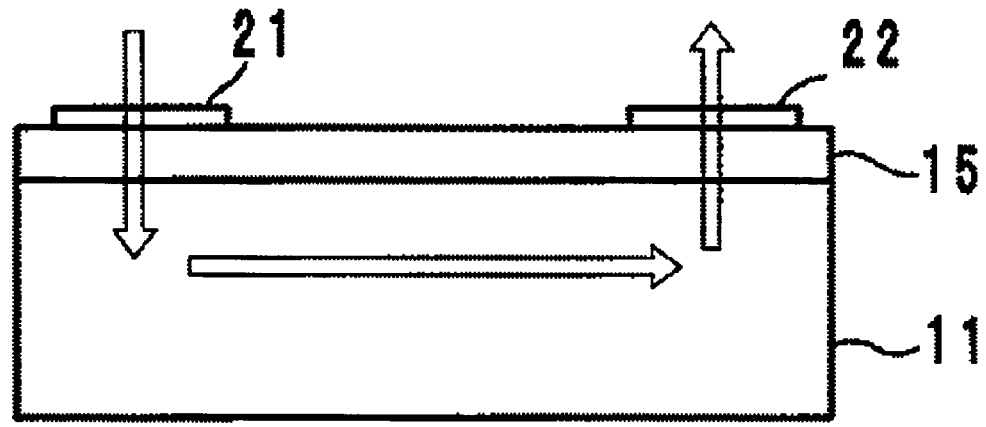
FIG. 4 shows a pathway of a current passing through the flexible thermistor 1A according to the first preferred embodiment of the present invention.

FIG. 4 is a view showing a pathway of a current flowing through the flexible thermistor 1B described above. Since the split electrodes 21 and 22 are provided on the surface of the semiconductor ceramic layer 15, as shown by the arrows in FIG. 4, the current passes along a pathway between two portions of the semiconductor ceramic layer 15, which are in contact with the split electrodes 21 and 22, via the metal substrate 11. Flexure of the flexible thermistor 1A is liable to occur, and when mounting is performed by a mounter, cracks are also liable to be generated in a central portion of the semiconductor ceramic layer 15. However, even if cracks are generated in the central portion of the semiconductor ceramic layer 15, the central portion is not the current pathway, and hence electrical characteristics as the flexible thermistor 1A are not adversely influenced.

FIGS. 5A-5E include views showing one example of a method for manufacturing the flexible thermistor 1A.

First, as a raw material of the semiconductor ceramic layer 15, oxides of Mn, Ni, Fe, Ti and/or the like are weighed to have a predetermined mixing ratio (in order to obtain a resistivity of about $10^4$ Ω·cm, for example) and are then sufficiently wet-pulverized using a ball mill with a pulverizing medium formed from zirconia and/or the like, and subsequently, calcination is performed at a predetermined temperature to obtain a ceramic powder.

After an organic binder is added to the ceramic powder, and a wet mixing treatment is then performed to form a slurry, the slurry thus obtained is formed into a ceramic green sheet on a PET-made carrier film 31 by a doctor blade method so as to obtain a semiconductor ceramic layer 15 having a thickness of about 1 μm to about 15 μm after firing, for example. A metal-substrate paste containing Ag—Pd as a primary component is formed into a metal substrate sheet on this ceramic green sheet by a doctor blade method so as to obtain a metal substrate 11 having a thickness of about 5 μm to about 100 μm after firing (see FIG. 5B), for example. Subsequently, the film 31, the sheet 15, and the sheet 11 are cut into a size of a mother sheet from which a plurality of components is to be formed, and the sheets 15 and 11 are then peeled away from the film 31 (see FIG. 5C). Next, on the ceramic green sheet, an Ag—Pd paste to be formed into the split electrodes 21 and 22 is applied by screen printing to form a laminate (see FIG. 5D).

Next, the mother sheet in the form of a laminate is cut into thermistor units (FIG. 5E). After one thermistor unit thus obtained is received in a zirconia-made container, or sagger and is then processed by a debinding treatment, firing is performed at a predetermined temperature (such as about 900° C. to about 1,300° C., for example).

By the steps as described above, the flexible thermistor 1A including the metal substrate 11, the semiconductor ceramic layer 15, and the split electrodes 21 and 22 is obtained.

Example 1

In Example 1, a flexible thermistor formed by the following method was evaluated.

First, after $MnO_3$, NiO, $Fe_2O_3$, and $TiO_2$ were weighed to have a resistivity of $10^4$ Ω·cm and were then sufficiently wet-pulverized by a ball mill using a pulverizing medium formed from zirconia and/or the like, calcination was performed at 700° C. to obtain a ceramic calcined powder formed of an oxide of Mn—Ni—Fe—Ti.

Next, an organic binder, a dispersant, and water were added to this calcined powder and were mixed together using zirconia balls for several hours to form a slurry, and the slurry thus obtained was processed by a doctor blade method into a ceramic green sheet so as to have a thickness of about 5 μm after firing.

A metal-substrate paste containing Ag—Pd as a primary component was applied on the ceramic green sheet thus obtained to form a metal substrate sheet to obtain a mother sheet so as to have a thickness of about 30 μm after firing. Subsequently, an Ag—Pd paste was screen-printed on the ceramic green sheet to form unfired split electrodes.

Next, after each mother sheet on which the split electrodes were formed was cut into thermistor units, and the thermistor units were each received in a zirconia-made container, or sagger and then processed by a debinding treatment, firing was performed at about 1,100° C., for example. As a result, a flexible thermistor including the metal substrate, a thermistor layer, and the split electrodes was obtained.

Next, a Ni plating film and an Sn plating film were formed by electrolytic plating on the thermistor obtained by firing. As a result, the Ni plating film and the Sn plating film were formed in this order on the surface of the metal substrate and the surfaces of the split electrodes.

A split electrode side of the flexible thermistor thus obtained was arranged on Au-plated Cu-metal lands which were formed on a glass epoxy substrate, and using a lead-free solder containing Sn—Ag—Cu as a primary component, solder mounting was performed in a reflow furnace at a peak temperature of about 260° C., for example.

The external dimensions of the obtained flexible thermistor were approximately 1.0 mm×0.5 mm×0.040 mm, for example. In addition, the dimensions of the split electrode, the dimensions of the land, a distance a from the peripheral end portion of the metal substrate to the peripheral end portion of the split electrode, a distance b from the peripheral end portion of the split electrode to the peripheral end portion of the land, and a distance c from the peripheral end portion of the metal substrate to the peripheral end portion of the land are shown in Table 1.

In addition, a direct-current resistance of a solder-mounted flexible thermistor was measured by a direct-current four-terminal method in a liquid bath at a temperature of about 25° C., and an incidence rate of short-circuit defects was evaluated. The number of evaluated thermistors was 1,000, and the incidence rate of short-circuit defects was calculated by (the number of short-circuited thermistors/1,000)×100(%).

erated. On the other hand, it was discovered that in Samples 3 to 5 in which the position of the peripheral end portion of the land was located inside the peripheral end portion of the metal substrate than the position of the peripheral end portion of the split electrode, the incidence rate of short circuit defects was 0%. The reason for this is that the distance from the peripheral end portion of the metal substrate to the peripheral end portion of the land can be sufficiently secured.

Second Example

FIG. 6 is a cross-sectional view showing a mounting structure of an electronic component 2A according to a second preferred embodiment of the present invention. In the flexible thermistor 2A, a protective layer 16' of an insulating material was provided on the entire surface of a metal substrate 11 except for portions thereof on which split electrodes 21 and 22 were provided. Accordingly, a Ni plating film 23 and an Sn plating film 24 provided on each of the split electrodes 21 and 22 could be reliably insulated from the metal substrate 11. Hence, solders 33 applied to lands 31 and 32 did not reach a peripheral side of the metal substrate 11 and were reliably prevented from rising to the metal substrate 11.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic-component mounting structure comprising:
an electronic component which includes a metal substrate, a semiconductor ceramic layer located on the metal substrate, a pair of split electrodes located on the semiconductor ceramic layer, and plating films located on the split electrodes and the metal substrate; and
a mounting body on which lands to be connected to the respective split electrodes of the electronic component are located; wherein
a position of a peripheral end portion of each land to be connected to the corresponding split electrode is located farther inside than a position of a peripheral end portion of the split electrode;

TABLE 1

| | EXTERNAL DIMENSIONS OF THERMISTOR 1.0 mm × 0.5 mm × 0.04 mm | | | | | |
|---|---|---|---|---|---|---|
| | DIMENSIONS OF SPLIT ELECTRODE μm | DIMENSIONS OF LAND μm | DISTANCE BETWEEN PERIPHERAL END PORTION OF METAL SUBSTRATE AND PERIPHERAL END PORTION OF SPLIT ELECTRODE a | DISTANCE BETWEEN PERIPHERAL END PORTION OF SPLIT ELECTRODE AND PERIPHERAL END PORTION OF LAND b | DISTANCE BETWEEN PERIPHERAL END PORTION OF METAL SUBSTRATE AND PERIPHERAL END PORTION OF LAND c = a + b | INCIDENCE RATE OF SHORT-CIRCUIT DEFECTS (%) |
| *1 | 300 × 350 | 300 × 365 | 50 | −10 | 40 | 10.1 |
| *2 | 300 × 350 | 300 × 350 | 50 | 0 | 50 | 0.08 |
| 3 | 300 × 350 | 300 × 340 | 50 | 10 | 60 | 0 |
| 4 | 300 × 350 | 300 × 330 | 50 | 20 | 70 | 0 |
| 5 | 300 × 350 | 300 × 320 | 50 | 30 | 80 | 0 |

As apparent from the above, it was discovered that in Sample 1 or 2 in which the position of the peripheral end portion of the land was located outside the peripheral end portion of the metal substrate than the position of the peripheral end portion of the split electrode or was located at the same position as that thereof, short-circuit defects were gena thickness of the metal substrate of the electronic component is about 10 μm to about 80 μm, and a thickness of the ceramic layer is about 1 μm to about 10 μm;

the position of the peripheral end portion of the split electrode is located farther inside than a position of a peripheral end portion of the semiconductor ceramic layer; and the position of the peripheral end portion of the split electrode is located farther inside than a position of a peripheral end portion of the metal substrate.

2. The electronic-component mounting structure according to claim 1, wherein a plane area of each land is smaller than that of the corresponding split electrode.

3. The electronic-component mounting structure according to claim 1, wherein the metal substrate of the electronic component has a sheet shape and is made from a metal powder paste, and the ceramic layer has a sheet shape and is made from a ceramic slurry.

4. The electronic-component mounting structure according to claim 3, wherein the sheet-shaped metal substrate and the sheet-shaped ceramic layer are defined by a fired integral laminate.

5. The electronic-component mounting structure according to claim 1, further comprising a protective layer including an insulating material and located on at least a surface of the ceramic layer on which the split electrodes are located.

6. The electronic-component mounting structure according to claim 1, wherein an electrolytic plating film is located on a surface of the metal substrate.

7. The electronic-component mounting structure according to claim 1, wherein the electronic component is a thermistor.

8. The electronic-component mounting structure according to claim 1, wherein a total thickness of the thermistor is about 10 μm to about 100 μm.

9. The electronic-component mounting structure according to claim 1, wherein the plating films include a Ni plating film and a Sn plating film.

10. The electronic-component mounting structure according to claim 1, wherein the semiconductor ceramic layer includes an NTC characteristic.

11. The electronic-component mounting structure according to claim 1, wherein the semiconductor ceramic layer includes at least one of Mn, Ni, Fe, Ti, Co, Al, and Zn.

12. The electronic-component mounting structure according to claim 1, wherein the metal substrate and the split electrodes are made of at least one of a single noble metal, a single base metal, and an alloy of at least one of the single noble metal and the single base metal.

13. The electronic-component mounting structure according to claim 1, wherein the metal substrate and the split electrodes are made of at least one of Ag, Pd, Pt, Au, Cu, Ni, Al, W and Ti, and an alloy of at least one of Ag, Pd, Pt, Au, Cu, Ni, Al, W and Ti.

14. The electronic-component mounting structure according to claim 1, wherein the position of the peripheral end portion of each land to be connected to the corresponding split electrode is located farther inside than a position of a peripheral end portion of the plating film located on the corresponding split electrode.

* * * * *